July 31, 1973 HISASHI MURAOKA ET AL 3,749,619

METHOD FOR MANUFACTURING A SEMICONDUCTOR INTEGRATED CIRCUIT ISOLATED BY DIELECTRIC MATERIAL

Filed June 21, 1971 5 Sheets-Sheet 2

United States Patent Office 3,749,619

Patented July 31, 1973

3,749,619

METHOD FOR MANUFACTURING A SEMICONDUCTOR INTEGRATED CIRCUIT ISOLATED BY DIELECTRIC MATERIAL

Hisashi Muraoka, Yokohama, Hiroshi Tsutsumi and Taizo Ohashi, Kanagawa-ken, Yasusuke Sumitomo, Yokohama, and Toshiko Yasui, Kawasaki, Japan, assignors to Tokyo Shibaura Electric Co., Ltd., Kawasaki-shi, Japan

Filed June 21, 1971, Ser. No. 155,193
Claims priority, application Japan, June 25, 1970, 45/54,751
Int. Cl. H01l 7/50
U.S. Cl. 156—17 12 Claims

ABSTRACT OF THE DISCLOSURE

A method for manufacturing an integrated circuit comprises steps of selectively epitaxial-growing island regions on the upper surface of a silicon substrate, covering said island regions and the upper surface of the substrate, forming a silicon layer on said insulating film and etching the silicon substrate with an etchant of HF, $HNO_3$ and $CH_3COOH$ which selectively etches the silicon substrate without etching the island region.

This invention relates to a method for manufacturing a semiconductor integrated circuit whose island regions are electrically insulated by a dielectric film.

There is already known an integrated circuit of the type where island regions formed in a semiconductor body are electrically insulated from each other by a layer of dielectric material such as silicon dioxide. This type of integrated circuit has its insulation capacitance reduced to less than about one-tenth of that associated with a junction isolated type circuit, and displays, as is well known, excellent frequency characteristics. On the other hand, said circuit has the drawback that its manufacturing process is considerably complicated with the resultant decreased yield. The main reason is that when there is lapped and polished a semiconductor substrate having island regions formed thereon, the respective thicknesses of said island regions are difficult to control.

The object of this invention is to provide a method for manufacturing in good yield a semiconductor integrated device having smooth and flat surfaced island regions electrically insulated from each other by a dielectric film.

The method of this invention consists in etching a high impurity semiconductor substrate on which there are epitaxially grown island regions having low impurity concentrations at least in those portions abutting on said substrate, using a prescribed etchant consisting of HF, $HNO_3$ and $CH_3COOH$ without subjecting these island regions to unnecessary etching. This processing enables said island regions to remain intact even during the etching of the substrate, that is, to maintain the prescribed width and surface smoothness with which the island regions were originally formed by epitaxial growth.

This invention can be more fully understood from the following detailed description when taken in connection with reference to the accompanying drawings, in which.

The present inventors conducted studies and experiments in connection with the etching of a semiconductor element and as a result have found that semiconductor elements having different impurity concentrations are etched at prominently varying rates according to the kinds and compositions of the etchants used.

Figure 1:
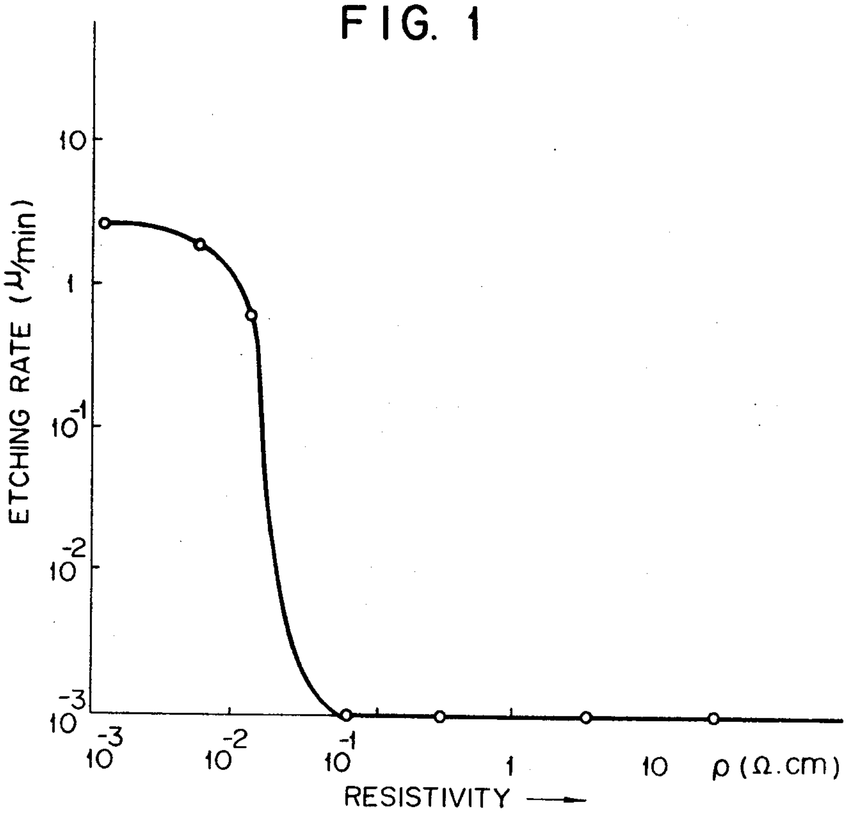
FIG. 1 is a curve diagram of the properties of an etchant used in the manufacturing process of this invention, showing the relationship of the etching rate of said etchant and the resistivity of a silicon substrate.

There will now be described by reference to the appended drawings the developments and results of said experiments. A known etchant having a ternary system of HF-$HNO_3$-$CH_3COOH$ used in etching a silicon element indicates an etching rate independent of the resistivity, conductivity type and crystallographic orientation of said silicon element, when the three components are mixed in the generally accepted ratio. However, when the acetic acid ($CH_3COOH$) component of said ternary etchant acting as a decelerating agent was used in increased proportions, the etching rate of the resultant etchant was found to be prominently affected by the resistivity of a silicon element, though it remained unaffected by the conductivity type and crystallographic orientation of said element. As shown in FIG. 1, an etchant consisting of three components of HF, $HNO_3$ and $CH_3COOH$ mixed in the volume ratio of, for example, 1:3:8 indicated an etching rate of 0.7 to 3$\mu$/min. where a silicon element had a resistivity of less than $1.5\times10^{-2}$ $\Omega\cdot$cm., whereas the etchant failed to perform etching at all, in case the silicon resistivity was higher than $6.8\times10^{-2}$ $\Omega\cdot$cm. Referring to FIG. 1, the etching rate was too minute to determine, where the resistivity was higher than $6.8\times10^{-2}$ $\Omega\cdot$cm., so that such rate was taken to be zero.

The foregoing results relate to the case where silicon elements of high and low resistivity were separately etched so as to accurately determine the etching rate. The reason for this separate etching is that where both types of silicon elements were jointly etched by the same etchant, the strong oxidizing action of nitrous acid ($HNO_2$) derived from the etching of the low resistivity silicon allowed the high resistivity silicon to be slightly etched. Determination was made of thhe rates at which there were jointly etched silicon elements of high and low resistivity or impurity concentration, the results being presented in Table I below wherein the numerical values in each of the boxes bearing a diagonal line are the respective etching rates in microns per minute.

Table I

| $P_1$ ($\Omega\cdot$cm) / $P_2$ ($\Omega\cdot$cm) | 0.068 | 0.30 | 3.2 | 25 |
|---|---|---|---|---|
| 0.0012 | 0.014 / 2.73 | 0.017 / 2.79 | 0.025 / 2.74 | 0.015 / 2.74 |
| 0.0058 | 0.025 / 1.10 | 0.018 / 1.28 | 0.006 / 1.30 | 0.011 / 1.75 |
| 0.010 | 0.011 / 0.79 | 0.002 / 0.73 | 0.004 / 0.80 | 0.006 / 0.79 |

Arsenic (As), antimony (Sb), phosphorus (P) and boron (B) used as impurities in the aforementioned experiments indicated the same results as shown in Table I above.

Table II below shows the results of determining the effects of the conductivity type and crystallographic orientation of a crystallized silicon substrate on the etching rate. As seen from this table, the etchant of this invention had its etching rate little affected by the conductivity type and crystallographic orientation of the substrate.

TABLE II

| x(Sɪ cm) | Crystallographic type of silicon | | | |
|---|---|---|---|---|
| | N (100) | N (111) | P (100) | P (111) |
| 0.001 to 0.002 | 2.5 | 2.3 | | |
| 0.006 to 0.008 | 1.9 | | | |
| 0.009 to 0.01 | 1.6 | | | 1.6 |
| 0.01 to 0.015 | 0.62 | 0.75 | | |
| 0.2 to 0.5 | | 0 | 0 | |
| 2 to 5 | | 0 | 0 | |
| 25 to 50 | | | | 0 |

The reason for the above results is assumed to originate with the following fact.

The dissolution of silicon by an etchant of $HF$-$HNO_3$ is supposed to proceed through the following two-step reaction.

$$Si+2(O)\rightarrow SiO_2 \qquad (1)$$

$$SiO_2+6HF\rightarrow SiF_6^{-2}+2H_2O+2H^+ \qquad (2)$$

Further, determination was made of the rates at which silicon elements of high and low resistivity were jointly etched with the temperature of an etchant solution varied, thereby defining "Arrhenius" Energy of Activation.

(a) N type (100) 0.002 Ω. cm. 5.15 kcal./mol (b) N type (100) 5.0 Ω. cm. 12.3 kcal./mol The value (a) above represents the reaction Formula 2, that is, the case where oxidation process is rate determining. The value (b) denotes the reaction Formula 1, that is, the case where the diffusion process of HF is rate determining. With a high resistivity silicon element, oxidation is a rate determining factor with the resultant slow etching rate, and with a low resistivity silicon element, the diffusion of HF is a rate determining factor to permit quick etching.

Figure 2:
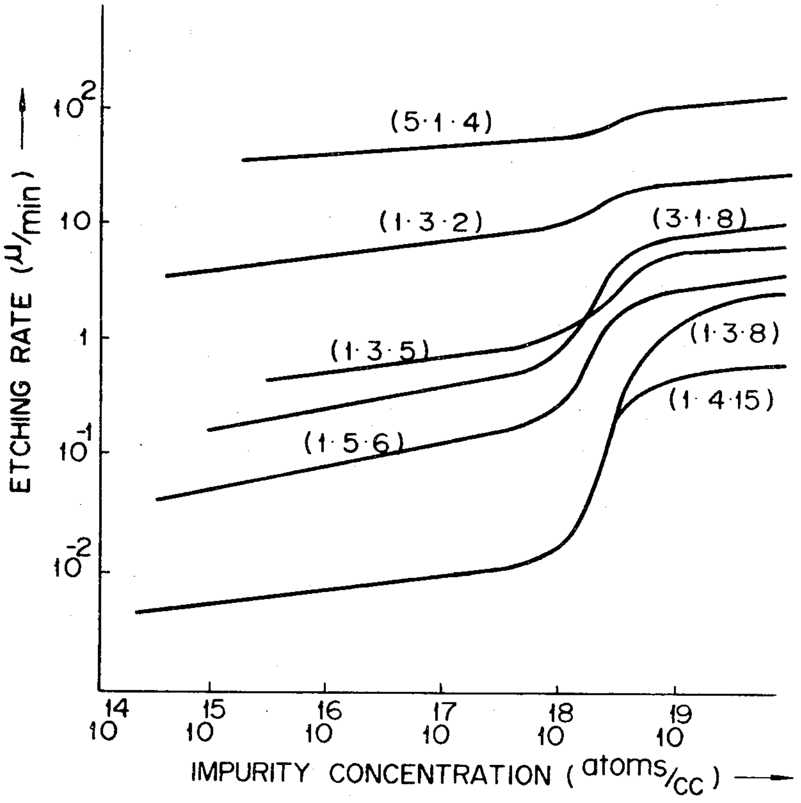
FIG. 2 is a curve diagram of the relationship of the etching rate of an etchant consisting of hydrogen fluoride (HF), nitric acid ($HNO_3$) and acetic acid ($CH_3COOH$) and the resistivity of a silicon substrate, where the proportions of these components were varied.

The foregoing results of determination were obtained with an etchant consisting of three components of HF, $HNO_3$ and $CH_3COOH$ which were compounded in the ratio of 1:3:8. When its composition is varied, an etchant of such a ternary system indicates, as shown in FIG. 2, prominently different etching rates with respect to silicon elements having high and low impurity concentrations. In FIG. 2, the different impurity concentrations of silicon elements are plotted on the abscissa and the etching rates on the ordinate, where said silicon elements were etched by etchants of a ternary system whose components were mixed in varying proportions. FIG. 2 shows that regardless of its composition, said ternary system etchant generally presented a sharp increase in the etching rate when the impurity concentration of a silicon element approached $10^{18}$ to $10^{19}$ atoms/cm.$^3$, and that the extent of said increase was considerably varied according to the composition of the etchant actually used. The etching rate of a ternary system etchant consisting of HF, $HNO_3$ and $CH_3COOH$ compounded in the ratio of, for example, 1:3:8 (denoted by the (1·3·8) curve) indicated a sudden rise at the aforesaid impurity concentration of $10^{18}$ to $10^{19}$ atoms/cm.$^3$, but presented no noticeable increase at higher impurity concentrations. In contrast, etchants having ternary compositions whose components were mixed in the ratios of 5:1:4 and 1:3:2 (represented by the (5·1·4) and (1·3·2) curves respectively) showed little variation in the etching rate at the above-mentioned impurity concentration.

Figure 3:
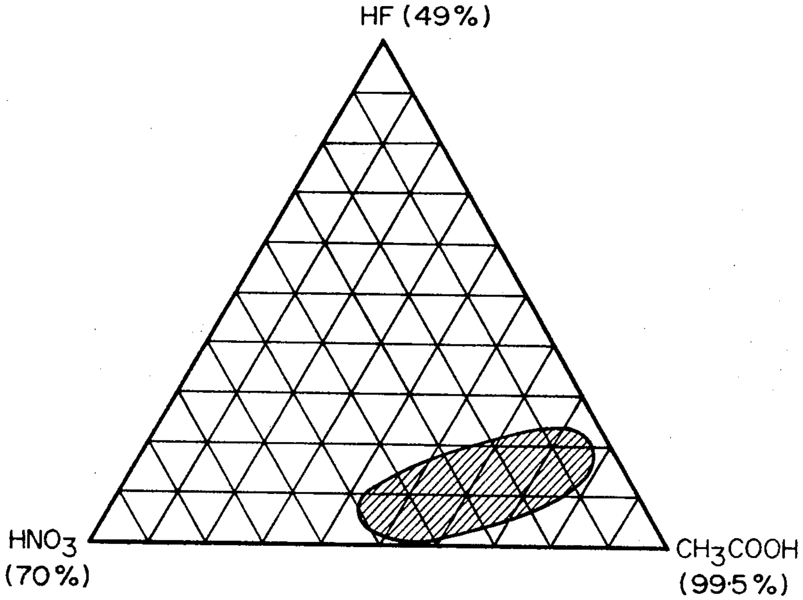
FIG. 3 is a triangular chart showing the preferred proportions of the three components of HF, $HNO_3$ and $CH_3COOH$ constituting the etchant used in the manufacturing process of this invention.

As mentioned above, an etchant comprising a ternary system of $HF$-$HNO_3$-$CH_3COOH$ in which $CH_3COOH$ has a prominently large proportion presents different etching rates with respect to jointly used silicon elements of high and low impurity concentrations. The etching rate for a silicon element of high impurity concentration is practically preferred to be over ten times quicker than that for a silicon element of low impurity concentration. If the difference between said etching rates falls to below said ratio, the object of this invention will not be fully attained. It has been experimentally found that the ternary composition of an etchant capable of realizing the preferred etching rate ratio should fall within the hatched region of FIG. 3. The preferred range of the ternary compostiion represented by said hatched region was determined by simultaneously etching an N type silicon element of (100) crystallographic orientation having a resistivity of 0.008 Ω·cm. and that having a resistivity of 5 Ω·cm with the same etchant. Main ratios of HF, $HNO_3$ and $CH_3COOH$ in said hatched region are 5:50:45, 20:20:60, 25:8:67, 15:5:80, 5:20:75 and 2:40:58.

When determination was made of the etching rate of the aforementioned etchant whose ternary composition had a ratio of 1:3:8, said etching rate was found to be as small as 0.05 $\mu$/min. with respect to a layer of silicon oxide. This etching rate only accounts for about 1/30 to 1/50 of that for a low resistivity silicon element. It will be apparent, therefore, that the etchant of this invention only dissolves a low resistivity silicon element, but does not substantially etch a high resistivity silicon element and an insulating layer made of, for example, silicon oxide, silicon nitride and alumina oxide. Three components of HF, $HNO_3$ and $CH_3COOH$ in the etchant used in the present invention are respectively solutions of 40, 70 and 99.5%.

Figure 4A:
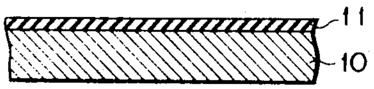
FIGS. 4A to 4G illustrate the sequential steps of an embodiment of the invention.
Figure 4B:
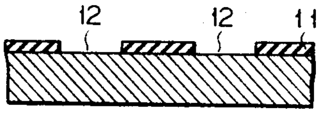
Figure 4C:
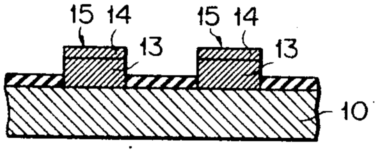
Figure 4D:
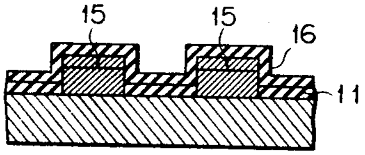
Figure 4E:
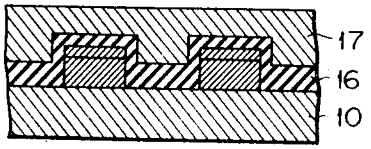
Figure 4F:
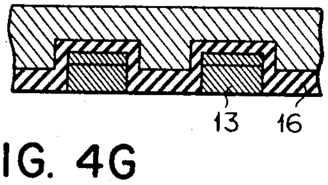
Figure 4G:
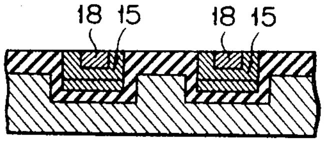

There will now be described by reference to FIGS. 4A to 4G the sequential steps of manufacturing according to an embodiment of this invention a semiconductor integrated circuit in which island regions are electrically insulated by a dielectric element. There is provided, as shown in FIG. 4A, an N type As or Sb doped monocrystalline silicon substrate 10 having an impurity concentration of about $1\times10^{19}$ atoms/cm.$^3$. The substrate is polished smooth on one side, where there is deposited a film 11 of insulation material such as SiO, $Si_3N_4$ or $Al_2O_3$ by thermally decomposing. The prescribed portions 12 of said insulation film 11 are photoetched, as shown in FIG. 4B, to form island regions thereon later. On the exposed portions of the surface of the substrate 10 are formed by selective epitaxial growth N type regions 13 having a predetermined thickness, on which there are further deposited $N^+$ type regions 14 of large amounts of a dopant such as As or Sb in said N type regions 13, thereby obtaining island regions 15 shown in FIG. 4C. The first portion 13 of the island region 15 which has to be formed with a higher resistivity than the substrate is doped, according to this invention, with antimony or arsenic at a concentration of $1\times10^{15}$ atoms/cm.$^3$. On the insulation layer 11 as well as on the island regions 15 are mounted, as shown in FIG. 4D, a film of silicon dioxide by thermally decomposing silane. This film 16 may consist of another material such as $Si_3N_4$ or $Al_2O_3$. On said silicon dioxide film 16 is formed, as shown in FIG. 4E a polycrystal layer 17 of silicon. This polycrystal layer 17 of silicon can be prepared by the ordinary epitaxial growth of silicon. After the aforesaid construction was completed, the silicon substrate 10 is etched off as shown in FIG. 4F. This etching is effected by the aforementioned ternary system etchant consisting of HF, $NHO_3$ and $CH_3COOH$ compounded in the ratio of 1:3:8. This etchant rapidly etches only the high impurity silicon substrate 10 but does not substantially etch the silicon dioxide film 16 and low impurity island regions 13, thereby allowing the surfaces of said film 16 and island regions 13 to remain smooth. After the substrate 10 is etched off, there are formed in the island regions 15 semiconductor elements such as transistors or diodes to complete an integrated circuit. FIG. 4G shows P type regions 18 formed as such elements.

In the present invention, there may be used P-type substrate and an island region formed by the epitaxy on said substrate of a suitable dopant such as boron.

The method according to this invention of manufacturing a semiconductor integrated circuit whose island regions are electrically insulated by a dielectric element enables an N type layer constituting an island region to be accurately controlled in thickness. The epitaxial growth of said island region on a semiconductor substrate permits easy control of its thickness, that is, allows it to be formed with any desired thickness. Moreover the island region is little etched, as described above, when the substrate is removed by the aforesaid etchant, so that said island region preserves its original thickness to the last.

Figure 5:
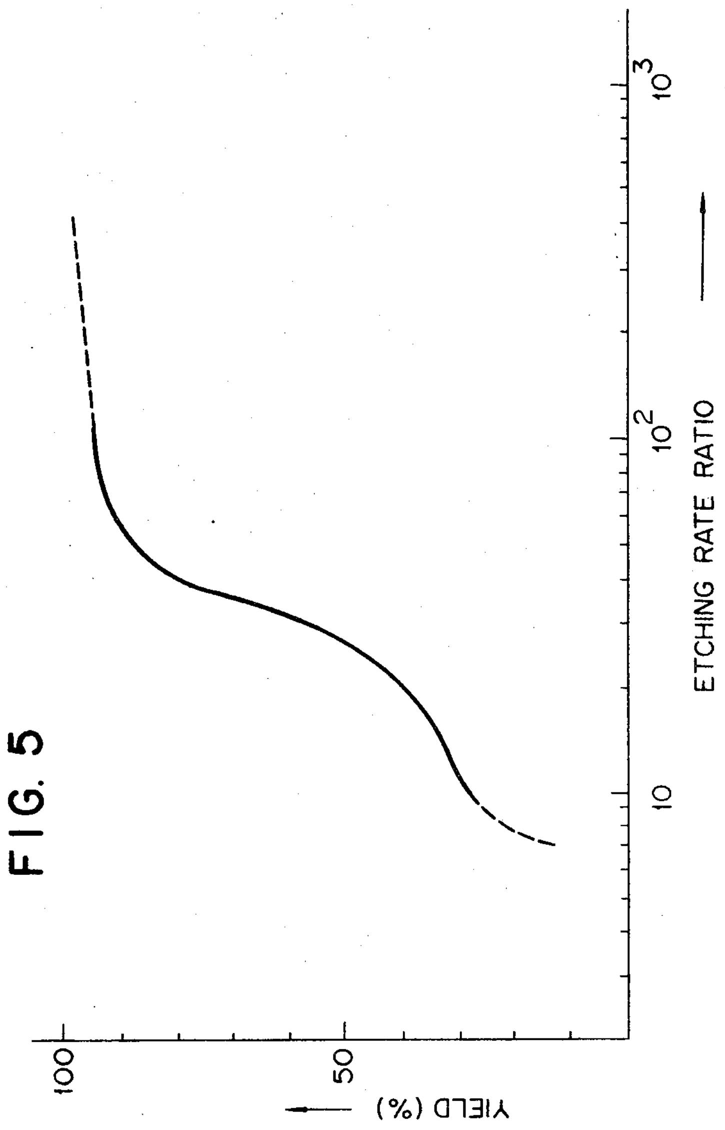
FIG. 5 is a curve diagram of the relationship of the etching rate and the yield of a semiconductor integrated circuit.

When there was determined the yield of an integrated circuit formed by applying the etchant of this invention which indicated different etching rates with respect to silicon elements of high and low impurity concentrations, there were obtained the results of FIG. 5. The ordinate denotes a percentage yield and the abscissa an etching rate (microns/min.). This figure shows that the ratio which the etching rate of the etchant of this invention for a high impurity silicon element bears to that for a low impurity silicon element should be at least 10 times, or preferably 30 to 40 times and, to obtain very good results, more than 100 times.

What we claim is:

1. A method for manufacturing an integrated circuit isolated by dielectric material comprising:

(a) preparing a monocrystalline silicon substrate of one conductivity type having an impurity concentration of more than $10^{18}$ atoms/cc. and having a main surface coated with an insulating film of dielectric material.

(b) partially etching said insulating film and forming an epitaxial growth region having an impurity concentration of less than $10^{17}$ atoms/cc. and of predetermined thickness on the main surface by masking of said etched insulating film, (c) coating said epitaxial growth region with an insulating film and forming a polycrystalline silicon layer on said insulating films, and (d) etching the silicon substrate thoroughly with an etchant consisting essentially of HF, $HNO_3$ and $CH_3COOH$ which selectively etches the silicon substrate without etching the epitaxial growth region to form an island of the epitaxial growth region isolated from the polycrystalline silicon layer by the insulating film.

2. A method for manufacturing an integrated circuit isolated by dielectric material according to claim 1, wherein the concentrations of HF, $HNO_3$ and $CH_3COOH$ in said etchant are 49, 70 and 99.5 percents, respectively, and the volume ratio of HF, $HNO_3$ and $CH_3COOH$ is 1:3:8.

3. A method for manufacturing an integrated circuit isolated by dielectric material according to claim 1, wherein HF, $HNO_3$ and $CH_3COOH$ in said etchant are admixed in a volume ratio defined within the hatched region of FIG. 3.

4. A method for manufacturing an integrated circuit isolated by dielectric material according to claim 1, wherein the concentrations of HF, $HNO_3$ and $CH_3COOH$ in said etchant are 49, 70 and 99.5 percents, respectively, and the etchant is one selected from the group consisting of etchants whose three components of HF, $HNO_3$ and $CH_3COOH$ respectively bear the volume ratios of 25:8:67, 5:50:45, 20:20:60, 15:5:80, 5:20:75 and 2:40:58.

5. A method for manufacturing an integrated circuit isolated by dielectric material according to claim 1, wherein the ratio of the etching rate of said substrate, and of said epitaxial growth region is more than 100:1.

6. A method for manufacturing an integrated circuit isolated by dielectric material according to claim 1, wherein said substrate is doped with at least one impurity selected from the group consisting of As and Sb to cause the substrate to have an N type conductivity.

7. A method for manufacturing an integrated circuit isolated by dielectric material according to claim 1, wherein said dielectric material is one selected from the group consisting of $SiO_2$, $Si_3N_4$ and $Al_2O_3$.

8. A method for manufacturing an integrated circuit isolated by dielectric material comprising:

(a) preparing a monocrystalline silicon substrate of one conductivity type having an impurity concentration of more than $10^{18}$ atoms/cc. and having a main surface coated with an insulating film of dielectric material, (b) partially etching said insulating film and forming an epitaxial growth region having an impurity concentration of less than $10^{17}$ atoms/cc. and of predetermined thickness on the main surface by masking of said etched insulating film, and further forming a highly doped epitaxial growth region on said epitaxial growth region above the main surface, (c) coating said epitaxial growth region with an insulating film and forming a polycrystalline silicon layer on said insulating films, and (d) etching the silicon substrate thoroughly with an etchant consisting essentially of HF, $HNO_3$ and $CH_3COOH$ which selectively etches the silicon substrate without etching the epitaxial growth region to form an island of the epitaxial growth region isolated from the polycrystalline silicon layer by the insulating film.

9. A method for manufacturing an integrated circuit isolated by dielectric material according to claim 3, wherein said substrate is doped with at least one impurity selected from the group consisting of As, Sb, P, and B.

10. A method for manufacturing an integrated circuit isolated by dielectric material according to claim 9, wherein said dielectric material is selected from the group consisting of $SiO_2$, $Si_3N_4$ and $Al_2O_3$.

11. A method for manufacturing an integrated circuit isolated by dielectric material according to claim 10, wherein the ratio of the etching rate of said substrate and said epitaxial growth region is more than 100:1.

12. A method for manufacturing an integrated circuit isolated by dielectric material according to claim 8, wherein HF, $HNO_3$ and $CH_3COOH$ in said etchant are admixed in a volume ratio defined within the hatched region of FIG. 3.

References Cited

UNITED STATES PATENTS

| | | | |
|---|---|---|---|
| 2,849,296 | 8/1958 | Certa | 156—17 |
| 3,461,003 | 8/1969 | Jackson | 148—175 |
| 3,507,713 | 4/1970 | Kravitz | 148—175 |
| 3,536,600 | 10/1970 | Van Dijk et al. | 204—143 |

OTHER REFERENCES

Fabrication of Planar Arrays of Semicond. Chips Separated by Insulated Barriers, IBM Tech. Discl. Bulletin, vol. 7, No. 11, April 1965.

JACOB H. STEINBERG, Primary Examiner

U.S. Cl. X.R.

148—175; 29—577; 317—235/22, 11